US 7,972,946 B2

(12) United States Patent
Shimazu et al.

(10) Patent No.: US 7,972,946 B2
(45) Date of Patent: Jul. 5, 2011

(54) PLASMA TREATMENT METHOD AND PLASMA TREATMENT DEVICE (75) Inventors: Tadashi Shimazu, Kobe (JP); Masahiko Inoue, Kobe (JP); Toshihiko Nishimori, Takasago (JP); Yuichi Kawano, Takasago (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 66 days.

(21) Appl. No.: 12/373,146

(22) PCT Filed: Jul. 24, 2007

(86) PCT No.: PCT/JP2007/064500
§ 371 (c)(1),
(2), (4) Date: Jan. 9, 2009

(87) PCT Pub. No.: WO2008/018291
PCT Pub. Date: Feb. 14, 2008

(65) Prior Publication Data
US 2009/0176380 A1    Jul. 9, 2009

(30) Foreign Application Priority Data

Aug. 11, 2006    (JP) .................. 2006-219839

(51) Int. Cl.
*H01L 21/425* (2006.01)
*H01L 21/31* (2006.01)
*H01L 21/469* (2006.01)
*H01L 21/00* (2006.01)
*H05H 1/24* (2006.01)
*H05H 1/02* (2006.01)
*H05H 1/10* (2006.01)

(52) U.S. Cl. . 438/514; 438/788; 438/792; 257/E21.057; 427/569; 427/571

(58) Field of Classification Search .......... 438/791–792; 427/574, 579, 255.27, 255.393
See application file for complete search history.

(56) References Cited

U.S. PATENT DOCUMENTS

| 4,481,229 | A | * | 11/1984 | Suzuki et al. ............... 427/571 |
| 2005/0214477 | A1 | * | 9/2005 | Hanawa et al. ............. 427/569 |
| 2005/0215005 | A1 | | 9/2005 | Allman et al. | |
| 2006/0105106 | A1 | | 5/2006 | Balseanu et al. | |

FOREIGN PATENT DOCUMENTS

| EP | 0677866 A1 | 10/1995 |
| EP | 1168427 A1 | 1/2002 |
| JP | 61-30040 A | 2/1986 |
| JP | 7-111261 A | 4/1995 |
| JP | 2004-064018 A | 2/2004 |

OTHER PUBLICATIONS

International Search Report of PCT/JP2007/064500, Mailing Date of Oct. 30, 2007.

(Continued)

*Primary Examiner* — Andy Huynh
*Assistant Examiner* — Valerie Brown
(74) *Attorney, Agent, or Firm* — Westerman, Hattori, Daniels & Adrian, LLP (57) ABSTRACT

Provided are a plasma treatment method and a plasma treatment device capable of forming a silicon nitride film having high compressive stress. In the plasma treatment method for depositing the silicon nitride film on a process target substrate by use of plasma of raw material gas containing silicon and hydrogen and of nitrogen gas, ion energy for disconnecting nitrogen-hydrogen bonding representing a state of bonding between the hydrogen in the raw material gas and the nitrogen gas is applied to the process target substrate so as to reduce an amount of nitrogen-hydrogen bonding contained in the silicon nitride film.

10 Claims, 5 Drawing Sheets

OTHER PUBLICATIONS

Supplementary European Search Report dated Mar. 24, 2010, issued in corresponding European Patent Application No. 07791225.1.

Korean Office Action dated Oct. 25, 2010, issued in corresponding Korean Patent Application No. 10-2008-7031919.

* cited by examiner

CROSS-SECTIONAL AREAS OF GENERATION OF EXCITED H ATOMS

PLASMA TREATMENT METHOD AND PLASMA TREATMENT DEVICE

TECHNICAL FIELD

The present invention relates to a plasma treatment method and a plasma treatment device.

BACKGROUND ART

Conventionally, a plasma CVD (chemical vapor deposition) method is frequently used in semiconductor manufacturing facilities in order to form an insulating film on a substrate to be processed, such as a semiconductor wafer housed inside a reaction container. When using the plasma CVD method, a gas for forming the insulating film is introduced into the reaction container in which plasma has been generated by applying RF (radio-frequency) power between a susceptor for placing the substrate to be processed and a face plate constituting the reaction container, so that the insulating film is formed on a surface of the substrate. A plasma CVD device of this type is called a capacitively-coupled plasma CVD device, and is the most typical plasma CVD device. At this time, it is preferable that the insulating film be a compressive stress film having equal to or below 200 MPa, so as to suppress film detachment or an influence on element characteristics. An example of this technique is disclosed in the following Patent Document 1.

According to the following Patent Document 1, the plasma is generated with low RF power equal to or below 500 W, and the insulating film is formed at a film forming rate equal to or below 500 nm/min. The compressive stress of the insulating film thus formed is approximately 100 MPa. A protective film formed for the purpose of insulation between elements such as transistors or between interconnections, or of preventing entry of moisture or the like, is also required to have a stress equal to or below 200 MPa.

Patent Document 1

Japanese Patent No. 3725100.

DISCLOSURE OF THE INVENTION

Problems to be Solved by the Invention

In a MOS transistor (which stands for three elements in a structure, namely, a metal, an oxide, and a semiconductor) used in a LSI, parasitic capacitance is reduced due to reduction in the area of transistor gate unit as a result of dimensional downsizing, thereby suppressing operational delays caused by transient response and leading to improvement in the circuit operation speed. There has been a fierce competition in the field of LSI development, striving to realize smaller elements. However, the thickness of gate oxide films used in a transistor structure has already been reduced close to a physical limitation, and the thickness of insulating films between elements or interconnections are also being reduced now. In this context, a drastic increase in leak current inside an LSI is becoming a problem in light of an increase in power consumption. Although reduction in power voltage has been implemented as a countermeasure for such problem, simple reduction in the voltage causes a decrease in the operating current on the transistor, which in turn leads to a delay in the operation speed. To solve this problem effectively, it is necessary to achieve downsizing together with improvement of element characteristics so as to enhance the operating current on the MOS transistor. A technique of applying a bias to a gate unit of the MOS transistor is now being employed as one of countermeasures for this problem. This technique utilizes the principle of increasing mobility of electrons or holes by applying the bias to the gate unit of the MOS transistor which functions as a passage of electrons or holes. A stress require in a 45-nm node transistor is expected to be in a range from 2 GPa to 3 GPa. Accordingly, a technique to form a high stress silicon nitride film on the MOS transistor has been developed as a technique to apply this stress to the gate unit of the MOS transistor.

However, as described in Japanese Patent No. 3725100, the compressive stress of a typical insulating film is around 100 MPa, which is far below the current requirement in the range from 2 GPa to 3 GPa.

From this point of view, an object of the present invention is to provide a plasma treatment method and a plasma treatment device which are capable of generating a silicon nitride film having a high compressive stress.

Means for Solving the Problems

To attain the object, a plasma treatment method according to a first aspect of the present invention provides a plasma treatment method for depositing a silicon nitride film on a process target substrate by using plasma of raw material gas containing silicon and hydrogen and of nitrogen gas, which is characterized in that ion energy for disconnecting nitrogen-hydrogen bonding representing a state of bonding between the hydrogen in the raw material gas and the nitrogen gas is applied to the process target substrate so as to reduce an amount of nitrogen-hydrogen bonding contained in the silicon nitride film, during deposition of the silicon nitride film.

To attain the object, a plasma treatment method according to a second aspect of the present invention provides the plasma treatment method according to the first aspect, which is characterized in that the ion energy is changed by changing bias power.

To attain the object, a plasma treatment method according to a third aspect of the present invention provides the plasma treatment method according to the second aspect, which is characterized in that the ion energy is changed by changing ratio-frequency power.

To attain the object, a plasma treatment method according to a fourth aspect of the present invention provides the plasma treatment method according to any one of the second and third aspects, which is characterized in that the ion energy is changed by changing pressure.

To attain the object, a plasma treatment method according to a fifth aspect of the present invention provides the plasma treatment method according to the second aspect, which is characterized in that the ion energy is changed by changing the amounts of gas supply.

To attain the object, a plasma treatment method according to a sixth aspect of the present invention provides the plasma treatment method according to the third aspect, which is characterized in that the ion energy is changed by changing the amounts of gas supply.

To attain the object, a plasma treatment method according to a seventh aspect of the present invention provides the plasma treatment method of the fourth aspect, which is characterized in that the ion energy is changed by changing the amounts of gas supply.

To attain the object, a plasma treatment device according to an eighth aspect of the present invention is characterized by including: raw material gas supplying means for supplying raw material gas containing silicon and hydrogen into a vacuum container; nitrogen gas supplying means for supplying nitrogen gas into the vacuum container; pressure control means for controlling pressure inside the vacuum container; plasma generating means for generating plasma by applying RF power to the raw material gas and the nitrogen gas inside the vacuum container; supporting means for supporting a process target substrate at a lower part inside the vacuum container, the supporting means being provided with a heating function; bias power applying means for applying bias power to the supporting means, and parameter control means for controlling the bias power of the bias power applying means, the RF power of the plasma generating means, the pressure of the pressure control means, and the amounts of gas supply of the raw material gas supplying means and of the nitrogen gas supplying means. The plasma treatment device according to the eighth aspect of the present invention is further characterized in that: by controlling the bias power, the RF power, the pressure, and the amounts of gas supply using the parameter control means, ion energy for disconnecting nitrogen-hydrogen bonding representing a state of bonding between the hydrogen in the raw material gas and the nitrogen gas is applied to the process target substrate so as to reduce an amount of nitrogen-hydrogen bonding contained in a silicon nitride film, during deposition of the silicon nitride film.

EFFECT OF THE INVENTION

According to the first aspect of the invention, in the plasma treatment method for depositing a silicon nitride film on a process target substrate by using plasma of raw material gas containing silicon and nitrogen and of nitrogen gas, ion energy for disconnecting nitrogen-hydrogen bonding representing a state of bonding between the hydrogen in the raw material gas and the nitrogen gas, is applied to the process target substrate so as to reduce an amount of nitrogen-hydrogen bonding contained in the silicon nitride film, during deposition of the silicon nitrogen film. In this way, it is possible to form the dense silicon nitrogen film and thereby to dramatically increase compressive stress of the silicon nitrogen film.

According to the second aspect of the present invention, in addition to the effect of the first aspect, the amount of N—H bonding in the silicon nitride film can be reduced effectively, by changing the bias power to change the ion energy. In this way, it is possible to dramatically increase the compressive stress of the silicon nitride film.

According to the third aspect of the present invention, in addition to the effect of the second aspect, the supplied nitrogen can be decomposed reliably by changing the RF power to change the ion energy. In this way, it is possible to efficiently reduce the amount of N—H bonding in the silicon nitride film and thereby to dramatically increase the compressive stress of the silicon nitride film.

According to the fourth aspect of the present invention, in addition to the effect of any of the second and third aspects, collisions of ions are reduced at the time of applying the bias power, by changing the pressure to change the ion energy, so that the ions efficiently are attracted onto a surface of the substrate. Hence the amount of N—H bonding in the silicon nitride film is efficiently reduced, which in turn increases the compressive stress of the silicon nitride film dramatically.

According to the fifth to seventh aspects of the present invention, in addition to the effect of any one of the second to fourth aspects, a probability of bonding between the silicon and the nitrogen is increased by changing the gas supply amount to change the ion energy, and thereby the amount of N—H bonding in the silicon nitride film can be efficiently reduced. This in turn increases the compressive stress of the silicon nitride film dramatically.

According to the eighth aspect of the present invention, a plasma treatment device according to the present invention is provided with: raw material gas supplying means for supplying raw material gas containing silicon and hydrogen into a vacuum container; nitrogen gas supplying means for supplying nitrogen gas into the vacuum container; pressure control means for controlling pressure inside the vacuum container; plasma generating means for generating plasma by applying RF power to the raw material gas and the nitrogen gas inside the vacuum container; supporting means for supporting a process target substrate at a lower part inside the vacuum container, the supporting means being provided with a heating function; bias power applying means for applying bias power to the supporting means; and parameter control means for controlling the bias power of the bias power applying means, the RF power of the plasma generating means, the pressure of the pressure control means, and gas supply amount of the raw material gas supplying means and of the nitrogen gas supplying means. Moreover, it is possible to reduce an amount of N—H bonding in a silicon nitride film, during deposition of the silicon nitride film, by controlling the bias power, the RF power, the pressure, and the gas supply amount with use of the parameter control means, and further by applying ion energy for disconnecting nitrogen-hydrogen bonding representing a state of bonding between the hydrogen in the raw material gas and the nitrogen gas to the process target substrate. Since the amount of N—H bonding in the nitrogen film can be reduced efficiently, it is possible to make the silicon nitride film into a dense film so that the compressive stress of the silicon nitride film is dramatically increased.

EXPLANATION OF LETTERS OR NUMERALS

1 Plasma Treatment Device
10 Vacuum Container
11 Cylindrical Container
12 an upper part of the Ceiling Plate
13 the Pressure of the Vacuum Container
14 Plasma
15 RF Antenna 16,26 Rectifier
17 RF Power Source
18 Raw Material Gas Supply Nozzle
19 $N_2$ Supply Nozzle
20 Substrate
21 Wafer Support Table
22 Mount Unit
23 Support Shaft
24 Heater
25 Capacitor
27 Bias Power Source
28 Static Power Source
29 Low-Pass Filter (LPF)

BEST MODES FOR CARRYING OUT THE INVENTION

Figure 1:
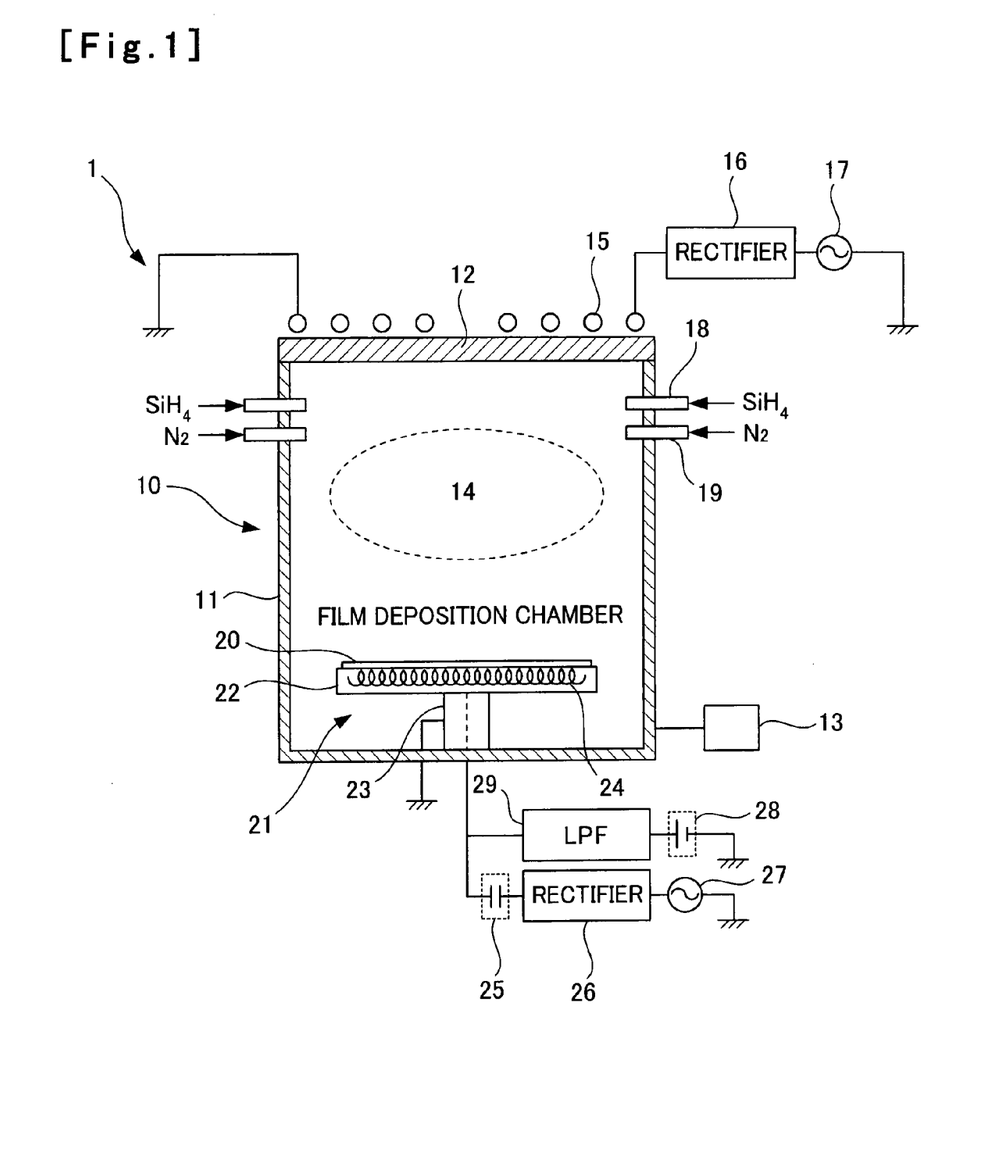
FIG. 1 is a configuration diagram showing a plasma treatment device according to an embodiment of the present invention.
Figure 2:
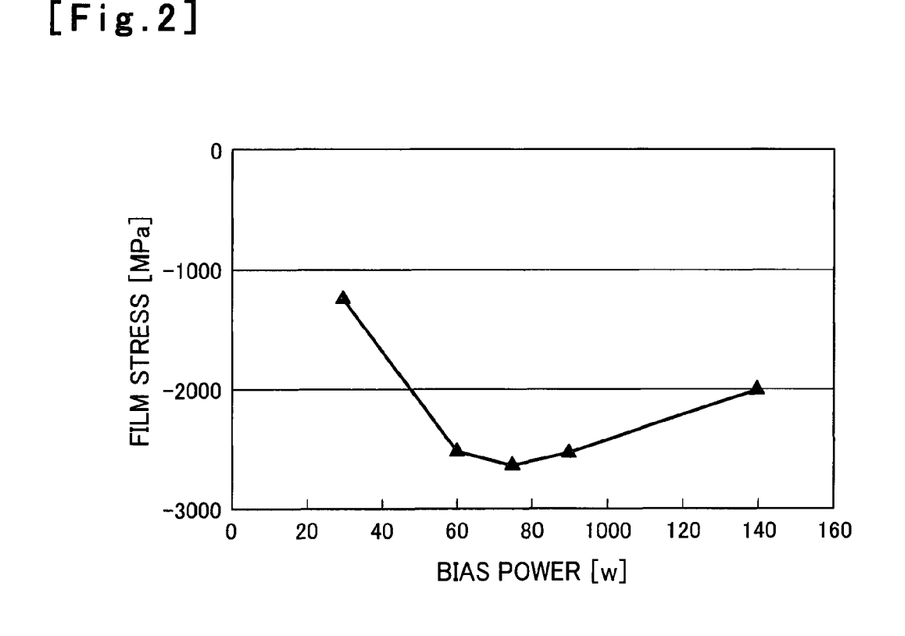
FIG. 2 is a graph showing a relation between bias power and film stress according to the embodiment of the present invention.
Figure 3:
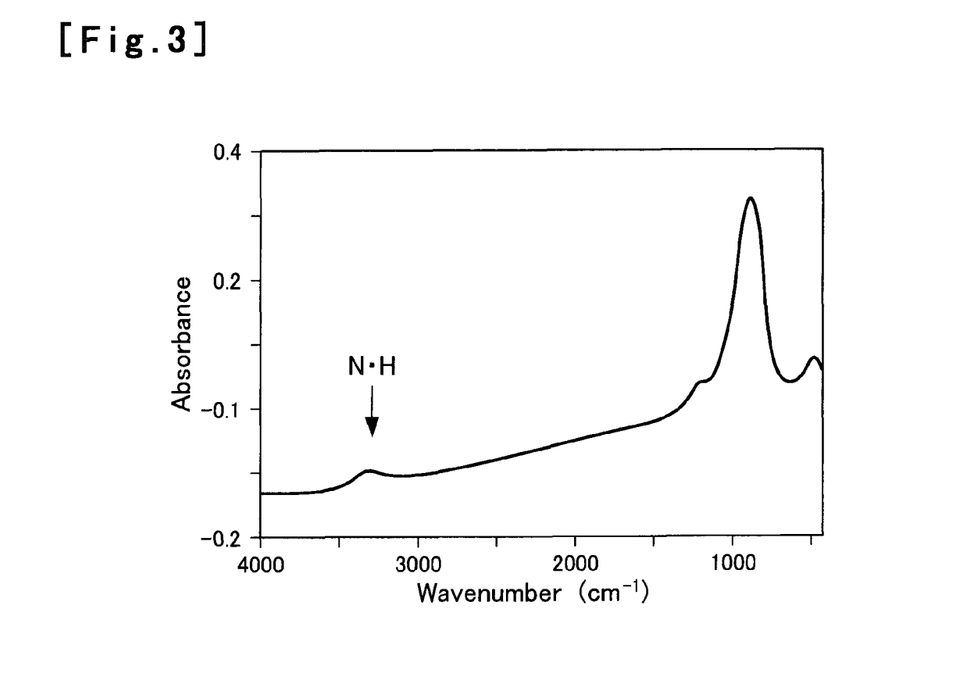
FIG. 3 is a graph showing an example of a FTIR characteristic.
Figure 4:
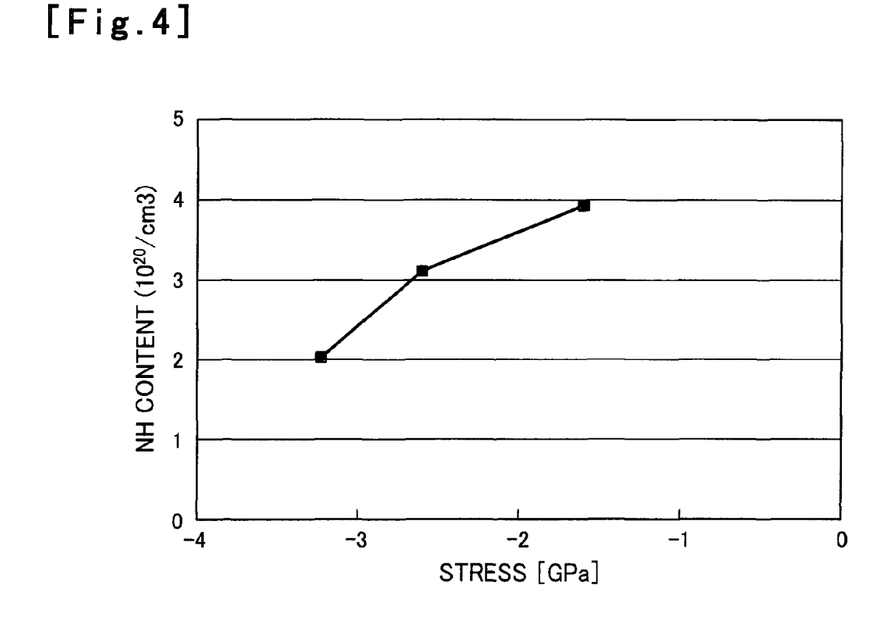
FIG. 4 is a graph showing a relation between the film stress and NH content according to the embodiment of the present invention.
Figure 5:
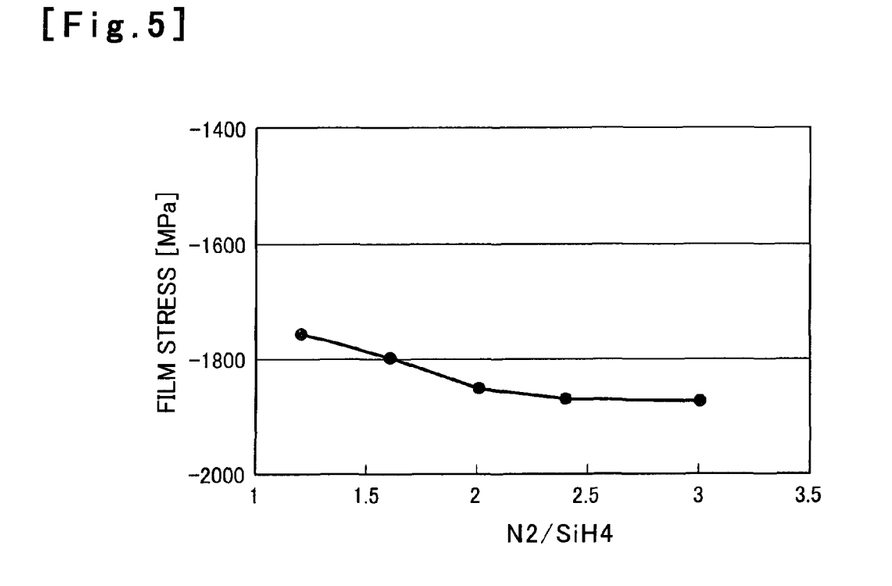
FIG. 5 is a graph showing a relation between $N_2/SiH_4$ and the film stress according to the embodiment of the present invention.
Figure 6:
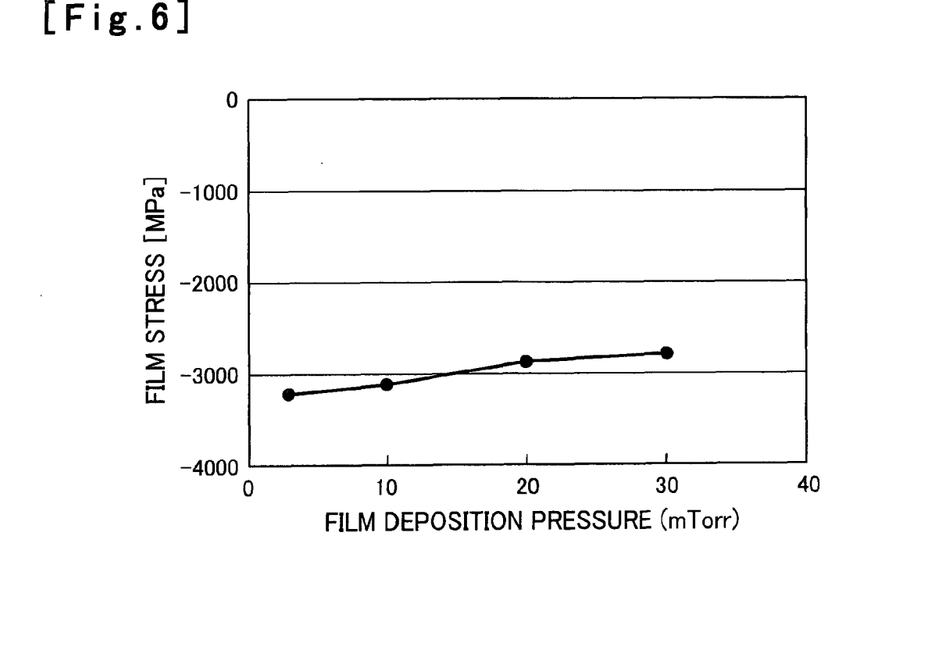
FIG. 6 is a graph showing a relation between film forming pressure and the film stress according to the embodiment of the present invention.
Figure 7:
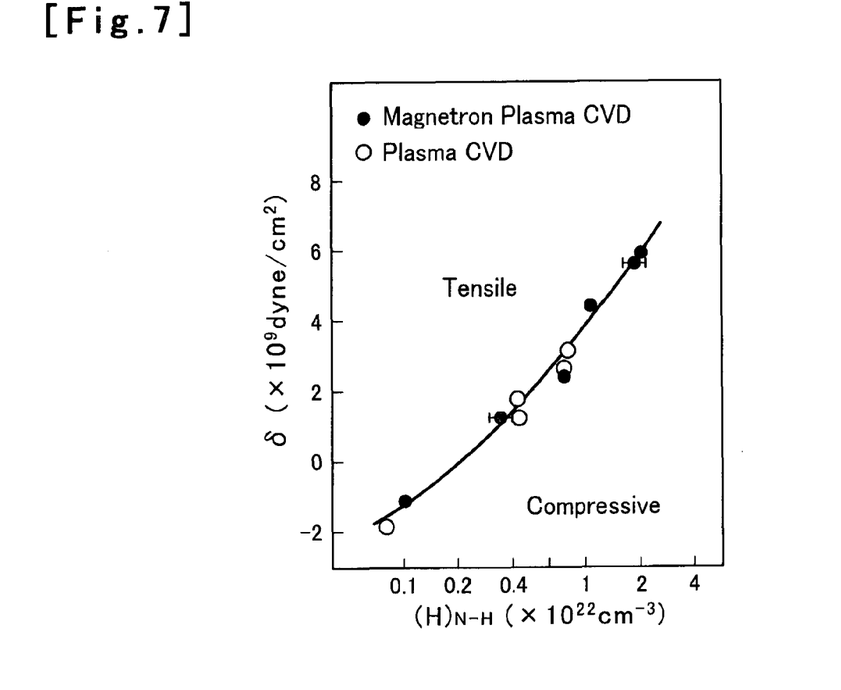
FIG. 7 is a graph showing a relation between an amount of N—H bonding in a film and stress of a SiN film according to the embodiment of the present invention.
Figure 8:
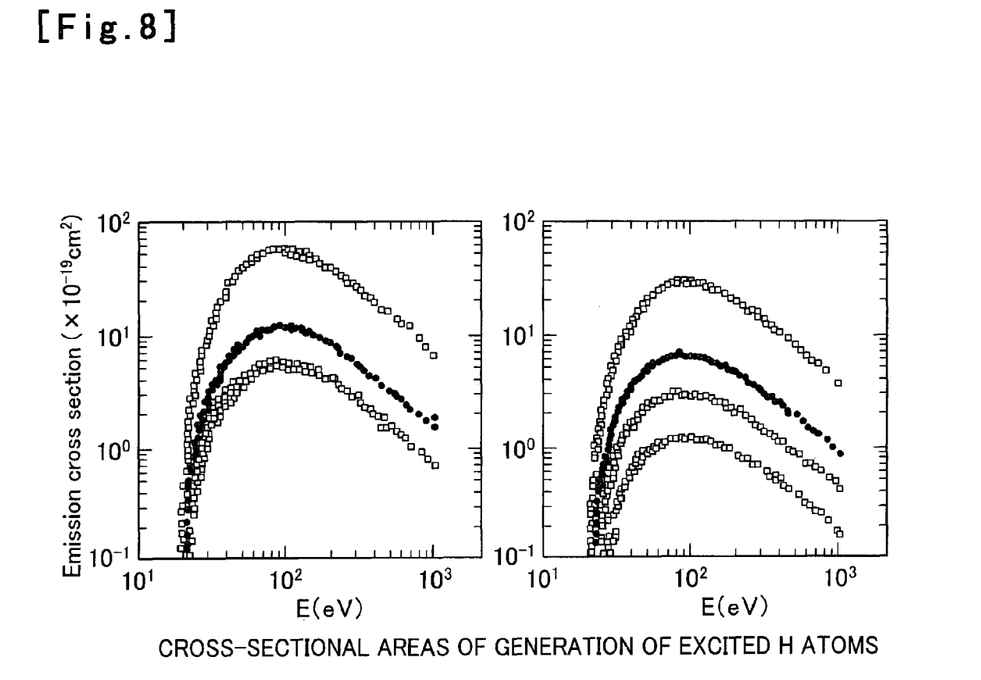
FIG. 8 is a view showing dissociative excitation of $CH_4$ molecules caused by electron collisions.

A plasma treatment method and a plasma treatment device according to the present invention will be described with reference to FIG. 1 to FIG. 8. FIG. 1 is a configuration diagram showing a plasma treatment device according to an embodiment of the present invention. FIG. 2 is a graph showing a relation between bias power and film stress according to the embodiment of the present invention. FIG. 3 is a graph showing an example of a FTIR characteristic. FIG. 4 is a graph showing a relation between the film stress and NH content according to the embodiment of the present invention. FIG. 5 is a graph showing a relation between $N_2/SiH_4$ and the film stress according to the embodiment of the present invention. FIG. 6 is a graph showing a relation between film forming pressure and the film stress according to the embodiment of the present invention. FIG. 7 is a graph showing a relation between an amount of N—H bonding in a film and stress of a SiN film according to the embodiment of the present invention. FIG. 8 is a view showing dissociative excitation of $CH_4$ molecules caused by electron collisions.

FIG. 7 shows the relation between the amount of N—H bonding in a film and stress of a SiN film in the case of magnetron plasma CVD and plasma CVD (capacitively-coupled plasma CVD). Here, the lateral axis indicates the amount of N—H bonding in the film while the longitudinal axis indicates the stress of the SiN film. Moreover, the stress of the SiN film on the longitudinal axis is indicated in a way that a value greater than 0 means stress in a tensile direction while a value smaller than 0 means stress in a compressive direction.

As shown in FIG. 7, it is apparent that an increase in the N—H bonding causes stronger stress of the film in the tensile direction and that a decrease in the N—H bonding, on the other hand, causes stronger stress of the film in the compressive direction. In other words, it is extremely effective to reduce the amount of N—H bonding in the SiN film in order to increase the compressive stress. Moreover, a same tendency is seen in the both cases of the magnetron plasma CVD and the plasma CVD (the capacitively-coupled plasma CVD), which indicates that the tendency remains the same regardless of the type of the plasma treatment device.

There are three conceivable options as a method for reducing the amount of N—H bonding in the film as described above, namely:
(1) selecting raw material gas which does not contain N—H bonding;
(2) applying plasma power for decomposing N—H bonding as much as possible; and
(3) causing collisions of ions having the same ion energy as N—H bonding energy with the N—H bonding in order to disconnect the N—H bonding effectively.

Among these methods, the methods (1) and (2) are feasible by using a high-density plasma treatment device. Concerning selection of the gas in the method (1), it is a general practice to select $SiH_4$ for the raw material gas containing silicon, and $NH_3$ for the raw material gas containing N, the $SiH_4$ being the most proven raw material gas that contains silicon in the LSI process. However, since the $NH_3$ has the N—H bonding, it is preferable to use $N_2$ gas instead. A capacitively-coupled plasma CVD device has a radio-frequency power (RF power) equal to or below 1 kW which is insufficient for decomposing the $N_2$ gas. However, a high-density plasma treatment device can apply radio-frequency power equal to or above 1 kW and is therefore able to decompose and use the $N_2$ gas.

FIG. 8 shows data of dissociative excitation of $CH_4$ molecules caused by electron collisions. Here, the lateral axis indicates collision energy of the electrons while the longitudinal axis indicates an amount of hydrogen atoms to be excited. As shown in FIG. 8, it is apparent that there is an optimum value for the collision energy necessary for disconnecting molecule bonding (that is, to disconnect H). FIG. 8 shows that this optimum value is somewhere around 100 eV. Moreover, it is also apparent that higher collision energy does not always lead to disconnection of more H. Conceivably, it is because the excessively high collision energy would go inside the substrate. Considering this case with ions, the excessive collision energy may disconnect Si—N bonding or cause physical etching of the film by sputtering, which is far deviating from the original purpose of selectively disconnecting the hydrogen bonding. Moreover, excessive bias power may attract the hydrogen ions and may lead to an increase of the amount of the N—H bonding in the SiN film.

To pull out the hydrogen selectively during a process of forming the SiN film, it is appropriate to utilize ion attraction onto a surface of a substrate that is a target of film formation by application of the bias power at the time of forming the SiN film. In the high-density plasma treatment device, there is a technique to execute etching and film formation simultaneously by applying bias voltage at the time of film formation, in order to enhance a performance to bury minute gaps. It is the publicly known technique to apply the bias voltage by use of the high-density plasma treatment device. However, this technique has been used for SiOx film formation.

The most important issue here is that the bias power necessary for etching reaches 3 kW even in the case of a wafer having a diameter of 200 mm, while the collision energy is generally set close to 200 eV to achieve high sputtering efficiency. As apparent from FIG. 2, optimum reduction in Si—H and N—H bonding cannot be invoked by simply applying the above-mentioned conditions to formation of the SiN film. That is, according to basic specifications of a conventional high-density plasma CVD device, application of the bias power for the purpose of disconnecting the hydrogen bonding has not been known.

Now, a configuration of a plasma treatment device according to an embodiment of the present invention will be described below. FIG. 1 is a block diagram of the plasma treatment device according to the embodiment of the present invention. As shown in FIG. 1, a plasma treatment device 1 includes a vacuum container 10 capable of maintaining a high degree of vacuum. In this vacuum container 10, a space hermetically sealed from outside air is formed by fitting a ceiling plate 12 to an upper part of a cylindrical container 11.

A vacuum device 13 for maintaining a vacuum state inside the vacuum container 10 is provided with the vacuum container 10. A RF antenna 15 for generating plasma 14 is placed on an upper part of the ceiling plate 12. A RF power source 17, which is a radio-frequency power source, is connected to this RF antenna 15 through a rectifier 16. That is, RF power supplied from the RF power source 17 is supplied to the plasma 14 through the RF antenna 15.

A raw material gas supply nozzle 18 for supplying raw material gas, which constitutes a raw material of the film to be formed, into the vacuum container 10 is placed on an upper part of a sidewall of the cylindrical container 11. In this embodiment, $SiH_4$ is supplied as the raw material gas. Moreover, an $N_2$ supply nozzle 19 for supplying $N_2$ into the vacuum container 10 is placed on the upper part of the sidewall of the cylindrical container 11. With this configuration, the plasma 14 of $SiH_4$ and $N_2$ is formed at an upper space inside the vacuum container 10.

A wafer support table 21 for holding a substrate 20, which is a film formation target, is provided at a lower part inside the cylindrical container 11. This wafer support table 21 includes a mount unit 22 for mounting the substrate 20 and a support shaft 23 for supporting this mount unit 22. A heater 24 for heating is disposed inside the mount unit 22. With this configuration, it is possible to control the temperature of the substrate 20 to a predetermined temperature during a plasma treatment. When the substrate is a silicon wafer, the thermal expansion coefficient of silicon is greater than that of SiN. Thus, higher temperature during the treatment leads to generation of a higher compressive stress due to a difference in the amount of contraction when the temperature returns to a room temperature. However, an upper limit of the treatment temperature is determined based on region of application for an LSI. For example, in the case of the treatment after a wiring process, the treatment temperature is generally set equal to or below 400° C. in consideration of an influence on a wiring material. 400° C. to 500° C. is the typical temperature to be applied to the SiN film in the vicinity of a transistor formed for the purpose of improving transistor characteristics is generally set in a range from.

A bias power source 27 is connected to the mount unit 22 through a capacitor 25 and a rectifier 26 so as to apply the bias voltage to the substrate 20. In this way, the ions in the plasma 14 are attracted onto the surface of the substrate 20. Moreover, a static power source 28 is connected to the mount unit 22 so as to hold the substrate 20 by use of an electrostatic force. This static power source 28 is connected to the mount unit 22 through a low-pass filter (LPF) 29 in order to avoid application of the power from the RF power source 17 or the bias power source 27 to the static power source 28.

Moreover, there is provided a parameter control device (not illustrated) which is capable of controlling the bias power of the bias power source 27, the RF power of the RF power source 17, the pressure of the vacuum container 13, and the gas supply amounts of the raw material gas supply nozzle 18 and of the $N_2$ gas supply nozzle 19.

In this embodiment, a silicon nitride film having high compressive stress is formed by controlling the respective parameters of the bias power, the RF power, the pressure, and the gas supply amounts with the parameter control device. Now, the plasma treatment method of this embodiment will be described below in detail.

In the plasma treatment method according to this embodiment, the low-output bias power source is employed for the high-density plasma treatment device, and an experiment for improving compressive stress of the SiN film is conducted in order to obtain the optimum bias necessary for disconnecting the N—H bonding. The bias power source only needs to have a capacity of 500 W even for a device adaptable to 300-mm wafers.

FIG. 2 shows a relation between the bias power and film stress according to the embodiment of the present invention. Here, the lateral axis indicates the bias power (W) while the longitudinal axis indicates the film stress (MPa). Moreover, an experiment is carried out with respect to the above-described plasma treatment device according to the embodiment of the present invention, and a wafer having a diameter of 200 mm is used. Moreover, conditions for film formation are set to SiH4=50 sccm, N2=100 sccm, RF power=2000 W, treatment temperature=250° C., and pressure=2 Pa or less, respectively.

As shown in FIG. 2, according to the experiment for improving the compressive stress of the SiN film, it is observed that the film stress can be dramatically improved by applying the bias power just as much as 75 W. Moreover, it is also observed that the compressive stress is gradually reduced by raising the bias power. Meanwhile, it is also observed that the film stress becomes equal to or above −2000 MPa at the bias power in a range from 45 W to 140 W, so that the high compressive stress is obtainable in this range. The bias power is usually set in a range from about 500 W to 3000 W under normal conditions of using the high-density plasma treatment device. Such bias condition therefore is extremely difficult to find.

Note that, it is satisfactory as long as the applied bias power is the same bias power per unit area of a wafer. In other words, the above-described condition can be applied to wafers having any diameters as long as the bias power is applied so as to be equal to the bias power per unit area of the wafer. For this reason, it is possible to say that the power up to approximately 300 W is an effective value in the case of a wafer having a diameter of 300 mm.

Meanwhile, the amount of N—H bonding in the SiN film can be figured out by use of FTIR (Fourier transform infrared spectroscopy) measurement. FIG. 3 shows an example of a FTIR characteristic. As shown in FIG. 3, a peak value of the N—H bonding is observable.

Here, a relation between the compressive stress and NH content in the film in the case of actually controlling the stress value was measured. FIG. 4 shows the relation between the film stress and the NH content according to the embodiment of the present invention. Here, the lateral axis indicates the stress (GPa) of the SiN film while the longitudinal axis indicates the NH content ($10^{20}/cm^3$). As shown in FIG. 4, it was confirmed that the amount of the N—H bonding was reduced by applying low bias voltage equal to or below several hundred volts, and that the compressive stress was increased as a consequence.

Next, a relation between the film stress and a proportion of gas flow rates that represents a proportion of the amount of supply of $N_2$ relative to the amount of supply of $SiH_4$, was also measured. FIG. 5 shows the relation between $N_2/SiH_4$ and the film stress. Here, the lateral axis indicates the $SiH_4$ while the longitudinal axis indicates the stress (MPa) of the SiN film. As shown in FIG. 5, it was confirmed that the amount of supply of $N_2$ was preferably set at least three times as much as the amount of supply of $SiH_4$.

Next, a relation between the pressure at the time of film formation and the film stress was also measured. FIG. 6 shows the relation between the pressure at the time of film formation and the film stress according to the embodiment of the present invention. Here, the lateral axis indicates the pressure (mTorr) at the time of film formation while the longitudinal axis indicates the stress (MPa) of the SiN film. As shown in FIG. 6, it is preferable that the pressure at the time of film formation be set as low as possible in order to increase the compressive stress. Moreover, in order to achieve the stress of the SiN film equal to or above −3000 MPa, i.e. the compressive stress equal to or above 3 GPa, it is apparent that the pressure at the time of film formation should be set equal to or below 15 mTorr, i.e. equal to or below 2 Pa.

These facts led to the conclusion that the conditions for forming SiN having high compressive stress should include: $SiH_4$ and $N_2$ as the types of supplied gas; the RF power equal to or above 2000 W; the bias power in the range from 45 to 300 W; the amount of supply of $N_2$ added at the proportion of three times or larger relative to the amount of supply of $SiH_4$, and the pressure equal to or below 2 Pa.

As described above, the plasma treatment method of this embodiment provides a method of subjecting the process target substrate to the plasma treatment by using the plasma of the raw material gas containing silicon and of nitrogen gas, which can reduce the amount of the N—H bonding in the formed silicon nitride film by applying the bias power at the time of processing the silicon nitride film. Moreover by reducing the amount of the N—H bonding in the silicon nitride film, the compressive stress of the silicon nitride film can be dramatically increased.

Meanwhile, by setting the bias power in the range from 45 W to 140 W for the diameter of 200 mm and changing the ion energy by changing the bias power, it is possible to disconnect the N—H bonding in the silicon nitride film efficiently. In this way, it is possible to reduce the amount of the N—H bonding in the silicon nitride film and thereby dramatically increase the compressive stress in the silicon nitride film.

Meanwhile, by setting the RF power equal to or above 2 kW for the diameter of 200 mm and changing the ion energy by changing the RF power, the supplied nitrogen can be decomposed reliably. In this way, it is possible to reduce the amount of the N—H bonding in the silicon nitride film more efficiently.

Meanwhile, by setting the pressure equal to or below 2 Pa and changing the ion energy by changing the pressure, collisions of the ions are reduced at the time of applying the bias power. Accordingly, it is possible to attract the ions efficiently onto the surface of the substrate and thereby to disconnect the N—H bonding efficiently.

Meanwhile, by setting the amount of supply of the nitrogen gas at least three times as much as the amount of supply of the raw material gas containing silicon and changing the ion energy by changing the amounts of gas supply, it is possible to reduce the amount of the N—H bonding in the silicon nitride film.

Meanwhile, according to the plasma treatment device of this embodiment, the plasma treatment device is provided with: the raw material gas supply nozzle 18 for supplying the raw material gas containing silicon and hydrogen into the vacuum container 10; the $N_2$ supply nozzle 19 for supplying the nitrogen gas into the vacuum container 10; the vacuum device 13 for controlling the pressure inside the vacuum container 10; the RF antenna 15, the RF power source 17 and the like for generating the plasma by applying the RF power to the raw material gas and the nitrogen gas inside the vacuum container 10; the mount unit 22 for supporting the process target substrate 20 at a lower part inside the vacuum container 10, the bias power source 27 for applying the bias power to the mount unit 22; and the parameter control device for controlling the bias power of the bias power source 27, the RF power of the RF antenna 15, the RF power source 17 and the like, the pressure of the vacuum device 13, and the amounts of gas supply of the raw material gas supply nozzle 18 and the $N_2$ supply nozzle 19. Moreover, during deposition of the silicon nitride film, it is possible to reduce the amount of N—H bonding in the silicon nitride film by controlling the bias power, the RF power, the pressure, and the amounts of gas supply with use of the parameter control means, and further by applying, to the process target substrate 20, the ion energy for disconnecting the nitrogen-hydrogen bonding representing the state of bonding between the hydrogen in the raw material gas and the nitrogen gas. As it is possible to efficiently reduce the amount of N—H bonding in the nitrogen film, the silicon nitride film can be formed into a dense film so that the compressive stress of the silicon nitride film can be dramatically increased.

INDUSTRIAL APPLICABILITY

The present invention is applicable, for example, to a plasma treatment method and a plasma treatment device in the case of depositing a silicon nitride film having high compressive stress.

The invention claimed is:

1. A plasma treatment method comprising forming a silicon nitride film on a process target substrate by using plasma of raw material gas containing silicon and hydrogen and of nitrogen gas, wherein ion energy for disconnecting nitrogen-hydrogen bonding representing a state of bonding between the hydrogen in the raw material gas and the nitrogen gas is irradiated onto the process target substrate so as to reduce the amount of nitrogen-hydrogen bonding contained in the silicon nitride film, and
   bias power is applied to the process target substrate in the range from 0.14 to 0.45 $W/cm^2$.

2. The plasma treatment method according to claim 1, wherein the ion energy is changed by changing bias power applied to the process target substrate.

3. The plasma treatment method according to claim 2, wherein the ion energy is changed by changing RF power applied for generating plasma.

4. The plasma treatment method according to claim 2, wherein the ion energy is changed by changing pressure.

5. The plasma treatment method according to claim 2, wherein the ion energy is changed by changing the amounts of gas supply.

6. The plasma treatment method according to claim 3, wherein the ion energy is changed by changing the amounts of gas supply.

7. The plasma treatment method according to claim 4, wherein the ion energy is changed by changing the amounts of gas supply.

8. The plasma treatment method according to claim 3, wherein the ion energy is changed by changing pressure.

9. The plasma treatment method according to claim 8, wherein the ion energy is changed by changing the amounts of gas supply.

10. A plasma treatment device comprising:
    raw material gas supplying means for supplying raw material gas containing silicon and hydrogen into a vacuum container;
    nitrogen gas supplying means for supplying nitrogen gas into the vacuum container;
    pressure control means for controlling pressure inside the vacuum container;
    plasma generating means for generating plasma by applying RF power to the raw material gas and the nitrogen gas inside the vacuum container;
    supporting means for supporting a process target substrate at a lower part inside the vacuum container, the supporting means being provided with a heating function;
    bias power applying means for applying bias power to the supporting means; and
    parameter control means for controlling the bias power of the bias power applying means, the RF power of the plasma generating means, the pressure of the pressure control means, and the amounts of gas supply of the raw material gas supplying means and of the nitrogen gas supplying means, wherein, by controlling the bias power, the RF power, the pressure, and the amounts of gas supply with use of the parameter control means, ion energy for disconnecting nitrogen-hydrogen bonding representing a state of bonding between the hydrogen in the raw material gas and the nitrogen gas is applied to the process target substrate so as to reduce the amount of nitrogen-hydrogen bonding contained in a silicon nitride film, during deposition of the silicon nitride film.

\* \* \* \* \*